US007191112B2

(12) United States Patent
Demler et al.

(10) Patent No.: US 7,191,112 B2
(45) Date of Patent: *Mar. 13, 2007

(54) MULTIPLE TEST BENCH OPTIMIZER

(75) Inventors: Michael J. Demler, Scotts Valley, CA (US); Stephen Lim, Scotts Valley, CA (US); Geoffrey Ellis, Santa Cruz, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 343 days.

This patent is subject to a terminal disclaimer.

(21) Appl. No.: 09/843,573

(22) Filed: Apr. 26, 2001

(65) Prior Publication Data

US 2004/0044509 A1 Mar. 4, 2004

Related U.S. Application Data

(60) Provisional application No. 60/200,611, filed on Apr. 28, 2000.

(51) Int. Cl.
*G06F 17/50* (2006.01)
*G06F 9/45* (2006.01)
(52) U.S. Cl. .................... 703/14; 716/2; 716/4
(58) Field of Classification Search ............ 703/14–16, 703/21; 716/2, 18, 4
See application file for complete search history.

(56) References Cited

U.S. PATENT DOCUMENTS 6,080,204 A * 6/2000 Mendel .................. 716/7
6,083,269 A * 7/2000 Graef et al. ............ 703/14
6,345,240 B1 * 2/2002 Havens .................. 703/21
6,477,683 B1 * 11/2002 Killian et al. ........... 716/1
6,678,645 B1 * 1/2004 Rajsuman et al. ....... 703/20

OTHER PUBLICATIONS

"MicroSim Pspice A/D & Basics+ Circuit Analysis Software, User's Guide", Version 8.0, Jun. 1997, pp. 1-2-1-14, 2-2-2-5.*
Kang et al, "CMOS Digital Integrated Circuits, Analysis and Design", second Edition, WCB/McGraw Hill, 1999, chapter 4.*
Lewis et al., "A Prototype Unit for Built-In Self-Test of Analog Circuits" IEEE Mar. 1999. p. 221-224.*
Frohlich et al., "A New Approach for Parallel Simulation of VLSI Circuits on a Transistor Level" IEEE 1998 vol. 45. No. 6.*
Orr-S., "Synthesys Tool Enables Mixed-Signal Core Design" EE Times Nov. 1999. p. 1-5.*

* cited by examiner

*Primary Examiner*—Paul Rodriguez
*Assistant Examiner*—Tom Stevens
(74) *Attorney, Agent, or Firm*—Fliesler Meyer LLP

(57) ABSTRACT

Test benches, simulations, and scripts are invoked in parallel for testing multiple points in a circuit being synthesized in an Analog Mixed Signal environment. A simulation system for simultaneously optimizing performance characteristics in circuit synthesis uses a set of design parameters. At least one circuit model is used to incorporate the set of design parameters, each circuit model adapted to model a portion of the circuit pertaining to a performance characteristic. At least one analysis test bench is then connected to each circuit model. Each analysis test bench is adapted to model circuitry external to the circuit and control the type of analysis to be performed for each performance characteristic of the circuit.

23 Claims, 4 Drawing Sheets

MULTIPLE TEST BENCH OPTIMIZER

This application claims priority from U.S. Provisional Application No. 60/200,611, filed Apr. 28, 2000, incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to circuit synthesis.

BACKGROUND OF THE INVENTION

The characteristic performance of an electronic circuit is typically described by a set of performance specifications. Within a given set of performance specifications may be characteristics of many different dimensions. Each dimension may relate to a different domain in which a circuit may be analyzed. Basic electrical specifications, such as those having dimensions of volts or amperes, may be analyzed in the DC domain of circuit operation. Specifications that relate to the time domain response of a circuit may be referred to as transient characteristics. Circuit characteristics, such as those that describe response as a function of signal repetition rate, may be analyzed in the frequency domain.

In addition to multiple analysis domains, each performance specification may be measured as a function of multiple sets of operating conditions. Some typical operating condition variables include circuit temperature, supply voltage, and fabrication process.

In order to synthesize a circuit that is suitable for a given application, it is desirable to optimize performance for all circuit characteristics in each analysis domain, preferably under multiple operating conditions. In one approach to circuit optimization, a circuit simulation program is used to perform each of the individual analyses required to measure performance. Each analysis domain then requires a separate simulation. In another approach, a sequential process is used to perform the required analyses in a serial manner. The time required to complete the analyses is the total sum of each individual analysis time. This approach does not lend itself to efficient, automated optimization, due to the time required to collect results of each iteration and to execute new iterations with each new set of optimization variables.

It is therefore an object of the present invention to develop a process for synthesizing a circuit that utilizes a minimal total analysis time.

It is also an object of the present invention to develop an improved process for optimizing performance objectives in circuit synthesis.

SUMMARY OF THE INVENTION

The present invention includes a method of simultaneously optimizing multiple performance characteristics in circuit synthesis. In the method, a set of circuit parameters is generated for each performance characteristic of a circuit. Each set of circuit parameters is then simultaneously or concurrently passed through a respective circuit model. Simulations are run in parallel for each circuit model on a respective analysis test bench, in order to measure the performance of each circuit model using the respective set of circuit parameters. Each analysis test bench models circuitry that may be external to the circuit, and controls the type of analysis to be performed for each performance characteristic.

Also included in the present invention is a simulation system for simultaneously optimizing performance characteristics in circuit synthesis. The system uses a set of design parameters for the circuit to be optimized. At least one circuit model is used to incorporate the set of design parameters, each circuit model adapted to model a portion of the circuit pertaining to a respective performance characteristic. At least one analysis test bench is connected to each circuit model. Each analysis test bench is adapted to model circuitry external to the circuit and control the type of analysis to be performed for each performance characteristic of the circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

In accordance with the foregoing summary of the invention, the following presents a detailed description of one embodiment of the present invention, which is presently considered to be the best mode.

The present invention includes a method of optimizing performance objectives in a circuit synthesis procedure. The objectives are optimized in a parallel manner, such that the total time of each iteration is reduced to the time of the longest individual analysis in a given set of analyses. The present invention also includes a circuit simulator to achieve such optimization.

In a preferred method of employing such a circuit simulator for optimization, three elements are combined. These elements include a set of design parameters, a circuit model, and an analysis test bench. The design parameters are assigned values during the optimization process, then used to modify the components of the circuit model.

In order to evaluate the performance of each circuit model and measure the effects of design parameter changes, a circuit model is preferably connected to an analysis test bench. A preferred analysis test bench models circuitry that may be external to the device being optimized, such as stimuli, power supplies, and load devices. The test bench also controls the type of analysis that is to be performed for optimization of each performance characteristic. Each analysis test bench may be used more than once, in order to analyze circuit performance over multiple operating conditions, such as temperature, supply voltage, and fabrication process.

Figure 1:
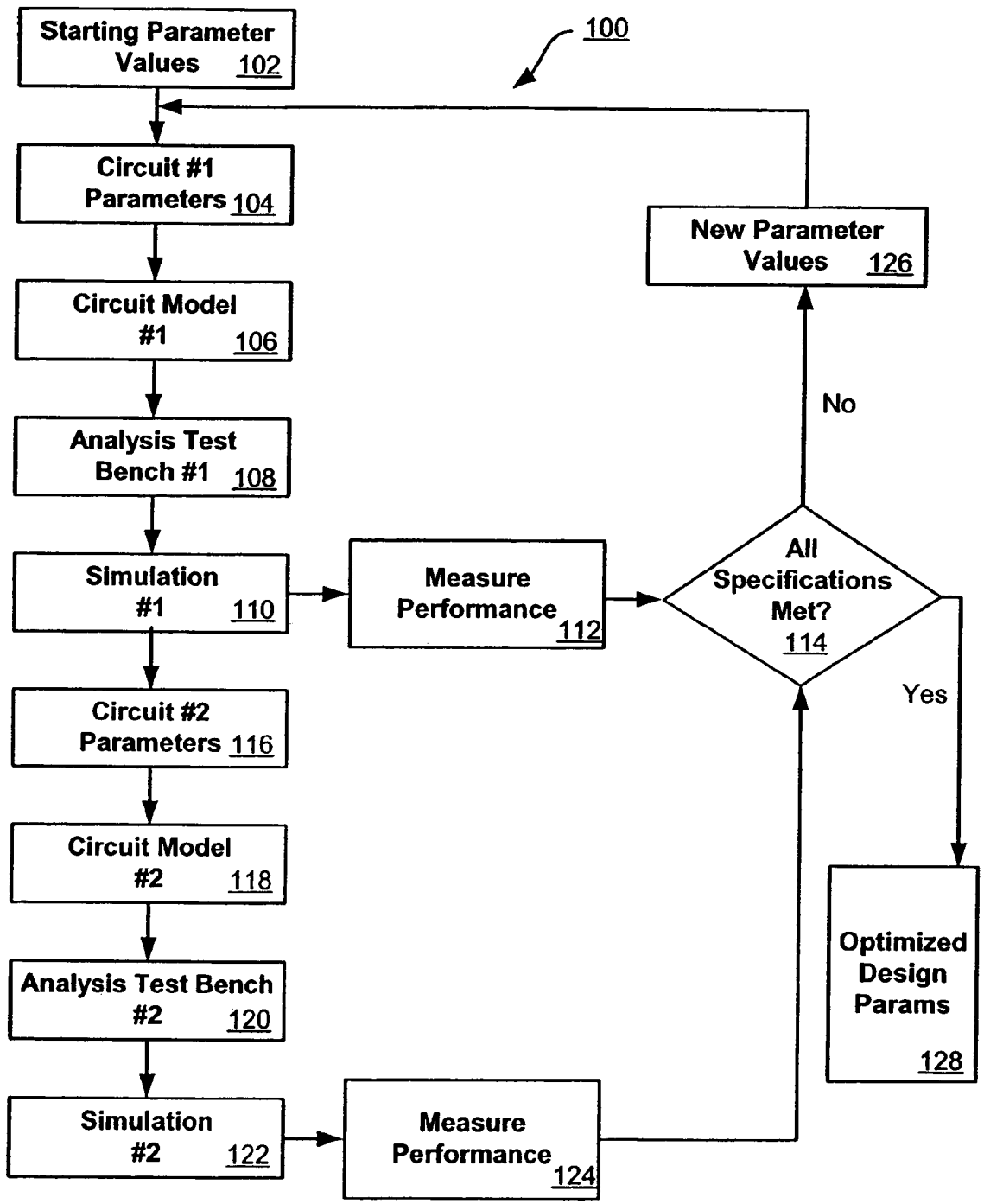
FIG. 1 is an example of an optimization process in accordance with one embodiment of the present invention.

The flow diagram of FIG. 1 describes an individual optimization process 100 using starting parameter values 102. The elements required for optimization are combined in order to perform a simulation. The simulator is limited to processing one type of analysis at a time, such as would use one set of circuit parameters 104, one circuit model 106, and one test bench 108 for a first simulation 110. The performance is then measured 112.

Since multiple models and test benches are required to measure all the performance specifications, the optimization of each specification is a serial process. For example, a second type of analysis is shown, using another set of circuit parameters 116, another circuit model 118, and another test bench 120 for a second simulation 122. Performance is measured for this analysis 124. Each individual simulation must be completed before the next simulation in that set can begin. Every additional analysis adds directly to the time required to complete one set of evaluations.

When all of the simulations are completed, the optimizer 114 collects the results of all performance measurements and executes a comparison of those measurements to the goals described by the performance specifications. If all performance specifications have been met, the parameter values 128 are saved and the simulation is completed. If the performance specifications have not been met, an optimization algorithm calculates a new set of parameter values 126 and a new set of simulations is run.

Figure 2:
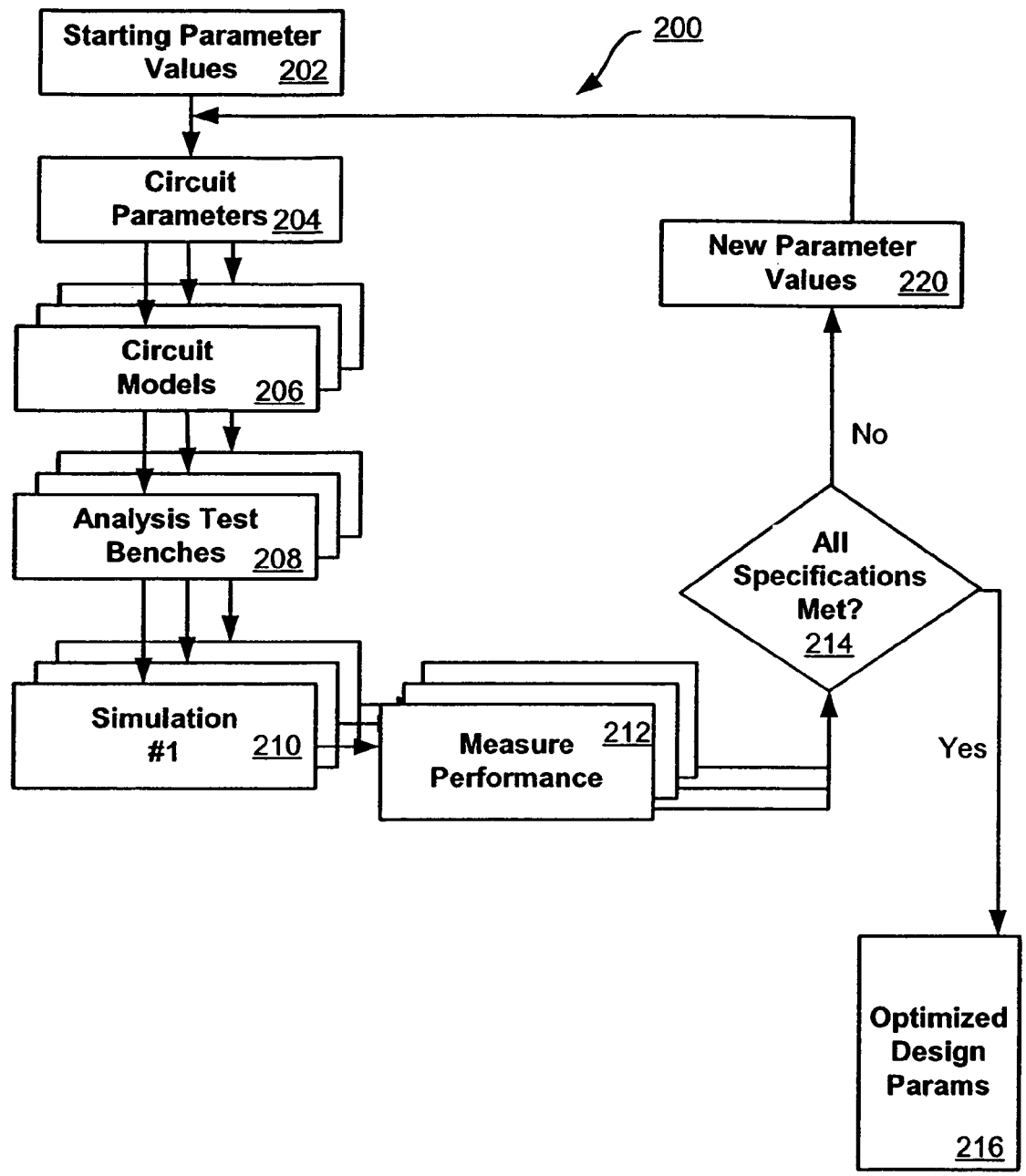
FIG. 2 is an example of a parallel optimization process in accordance with one embodiment of the present invention.

A preferred system 200 of the present invention combines the elements needed for optimizing each performance specification of a circuit, and for performing required analyses in parallel, as shown in FIG. 2. For each additional specification that is added, an additional simulation is performed concurrently with all other simulations. From a starting set of parameter values 202, a set of circuit parameters 204 is generated for each specification. Each set of circuit parameters is then passed simultaneously through the appropriate circuit models 206, analysis test benches 208, simulations 210, and performance measurements 212, as if each simulation was done separately. The Optimizer 214 then receives the performance measurements for each simulation and determines whether the specifications were met. For those analyses where the specifications are met, the parameters are designated as Optimized Design Parameters 216 for that specification and the loop ends. For the other simulations, new parameter values 220 are generated which are then sent back through the process.

For the system shown in FIG. 2, a mechanism is preferably provided to use additional CPUs for performing the simulations. This facilitates parallel processing without adding to the total analysis time. In order to analyze a circuit under multiple operating conditions, the invention preferably automatically generates an analysis test bench that may be modified for each of the specified conditions.

Figure 4:
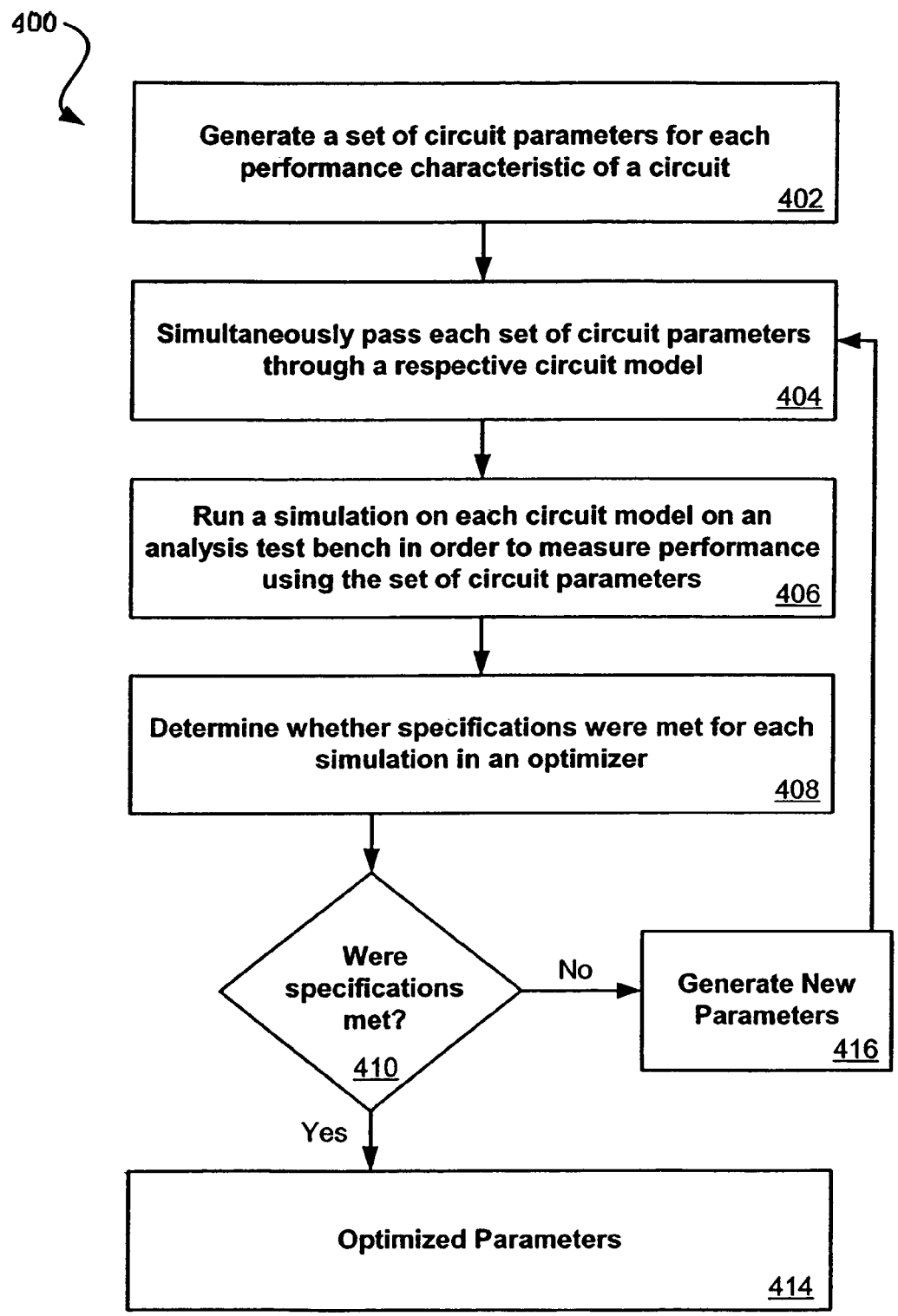
FIG. 4 is a diagram of an optimization method in accordance with one embodiment of the present invention.

FIG. 4 is a diagram of an optimization method in accordance with one embodiment of the present invention.

Figure 3:
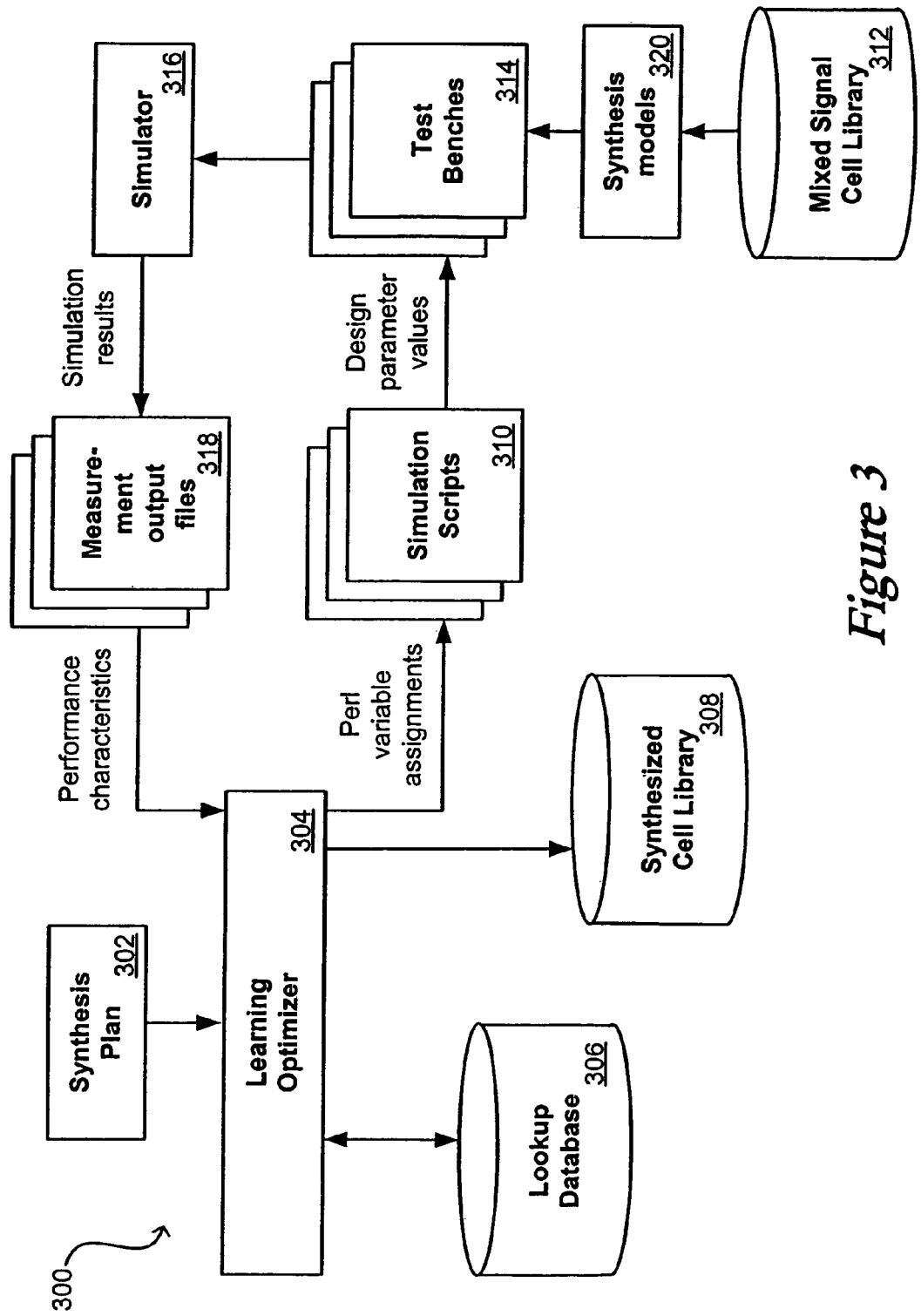
FIG. 3 is an example synthesis engine in accordance with one embodiment of the present invention.

A preferred system 300 for mixed signal synthesis (MSS) is shown in FIG. 3. The synthesis models, test benches, and simulation scripts of the system are shown in parallel. There may be multiple such simulation scripts and models identified by the plan. For example, each model may represent a different portion of a circuit, divided according to segments or partitioning. The multiple models are preferably launched in parallel as part of the optimization process. Each model is identified, having a set of test benches and simulation scripts that relate to that model. When the plan is executed, the optimizer sees the list(s) of models, and for each model a simulation process is executed. A simulation process may be automatically initiated by checking out a license for each test bench from a pool of simulation licenses. This may be performed by translating the plan description to a set of simulation processes to be run, which may be done on one or multiple machines. The machine(s) can look at each test bench as it is running and determine whether it needs to continue being evaluated. The optimizer and MSS engine preferably manage this process.

The synthesis engine of FIG. 3, or MSS engine, shows a data flow between a MSS Learning Mode Optimizer 304 and a Simulator 316, illustrating part of what the synthesis plan controls.

A Synthesis Plan 302 sets out rules for the optimization process. The optimization process is called by a Synthesis Model 320, which is preferably stored in a library of plans 312. In FIG. 3, the plan is represented as having a linear flow, but it should be understood that it may also have branches and/or subprocesses. The plan encapsulates knowledge for synthesizing a given design component and for the synthesis process. Part of the plan sets rules for optimization, while another part specifies the component in the library on which to be operated, and sets the criteria for desired performance.

Once set up and specified, the Optimizer 304 runs the Synthesis Plan 302 by passing the design parameter values to a Synthesis Model 320. The model is then simulated with a simulator 316, such as an AMS (Antrim Mixed Signal) Simulator, and has its results measured and passed back to the Optimizer 304, such as through measurement output files 318. Thus, the processes put the design through a loop, each loop recording results that pass from the MSS Learning Optimizer 304 to the Lookup Database 306. When the design is completed and the results have been obtained, or with each iteration of the loop, the Lookup Database 306 may have increased in size, and may further have additional reference points for future runs of the MSS engine or system.

The Lookup Database 306 is preferably the learning mode portion of the system, a collection of data including that which was learned by optimizing a particular design. The MSS engine 300 has typically taken a certain type of circuit, exercised several different design parameters values, and obtained differing levels of process performance. Information related to those levels of performance is preferably stored in the Lookup Database 306. Subsequent runs for a same or similar cell may therefore not need to go through the same loops, as the information may be looked up as needed.

In one embodiment, each user creates an individual synthesized library 308, although learned data is preferably provided to the Lookup Database. If one user pulls an individual plan out of the library and executes it, a set of performance specifications will be stored to the library. Later, if the same or a different user calls up the same plan, giving it a different set of performance specifications, the plan preferably takes advantage of the fact that the cell in that plan has been operated on before by reading data from the Lookup Database 306.

The Lookup Database 306 is preferably part of the reference library, and is built on over time. The MSS Learning Optimizer 304 preferably writes to and/or reads from a database when a user sets appropriate options, such as where the optimizer is required to learn or lookup information.

PERL variable assignments are one possible mechanism for allowing the Optimizer 304 to pass parameter values into a Simulation or Synthesis Model 320. In one embodiment, both the MSS engine and AMS simulator use the PERL language as their control layer. A number is passed into a PERL script and attached to a simulation model which is then simulated with AMS.

The Test Benches 314, such as a Verilog A/MS Test Bench, are simulation models having a circuit configuration attached to the model being synthesized, in order to perform a particular measurement. In one embodiment, each test bench is built for a particular measurement and circuit type.

A Simulation Script 310 preferably provides the necessary parameters, such as the design parameters of the circuit being synthesized, and sets up the appropriate test bench ranges. The Simulator 316 then runs the Test Bench 314. The Mixed Signal Cell Library 312 provides the appropriate circuit representation. The cell library may contain information regarding the circuit, but not information on how to apply the circuit to a particular application (referred to as parameterizing). The design variables also may not have been assigned values. After being pulled out of a library, MSS preferably assigns values to those design parameters for the circuit being synthesized. The Synthesis Model 320 may be any appropriate type of model, such as a generic synthesis model, or behavioral model. Regardless of the form it takes, the Synthesis Model 320 is generally used to map the function of a design variable to a performance parameter. For example, when synthesizing an amplifier, a performance parameter might be the gain of the amplifier. The model on which to be operated provides the design parameter(s) that influence performance. The design parameters may therefore involve transistor dimensions, bias current value, or other parameters one would adjust in order to make a circuit meet the appropriate performance specification. As an example, a behavioral optimization model may be done in a somewhat direct way. Alternatively, a circuit model may require more detail. Either way, the basic process pulls a model from the library, with the model getting design parameters in order to achieve a certain level of performance.

In one embodiment, topology selection may be performed in order to examine the performance of different amplifier implementations, in order to choose the one that is preferable for the application. The Mixed Signal Synthesis Engine is not restricted to a particular model. Once a model is selected, however, the looping process would be performed for that particular implementation.

The Simulator 316 is a preferred device for making measurements. The Test Bench(es) 314 provide(s) circuit configuration information needed to make a particular measurement. For example, if the gain of an amplifier is sought, it may be necessary to hook up the appropriate instruments by signal, measure a certain signal out, and run calculations to determine the gain. This approach is different than one that would be performed to measure the power of the amplifier. The Test Benches 314 preferably describe all these configurations, including information on and how to make the appropriate measurement(s), such as tat needed for the simulator to run the test bench. The Simulation Scripts 310 preferably provide instructions to take a Synthesis Model 320, apply specific parameters, hook up in a specified way, provide facilities to make specified measurements, and provide the information to the Simulator 316 for execution. FIG. 4 is a diagram of an optimization method in accordance with one embodiment of the present invention.

FIG. 4 is a diagram of an optimization method 400 in accordance with one embodiment of the present invention. As shown in FIG. 4, in block 402, a set of circuit parameters are generated for each performance characteristic of a circuit. In block 404, the method simultaneously passes each set of circuit parameters through a respective circuit model. In block 406, a simulation is run on each circuit model on an analysis test bench in order to measure performance using the set of circuit parameters. In block 408, the method determines whether specifications were met for each simulation in an optimizer. In block 410, if the specifications where met, then in block 414 the method outputs optimized parameters. Otherwise, in block 416, the method generates new parameters and returns to block 404.

A preferred embodiment may be implemented using a conventional, general purpose, or specialized computer or microprocessor, programmed according to the teachings of the present disclosure as would be apparent to one of ordinary skill in the computer arts.

Appropriate software coding may readily be prepared by skilled programmers based on the teachings of the present disclosure, as would be apparent to one of ordinary skill in the software arts. The invention may also be implemented by the preparation of application-specific integrated circuits, or by interconnecting an appropriate network of conventional component circuits, as would be readily apparent to one of ordinary skill in the art.

A preferred embodiment of the present invention utilizes a computer program product including a storage medium having instructions stored thereon/in, which may be used to control, or cause, a computer to perform any of the processes of the present invention. The storage medium may include, but is not limited to, any type of storage medium including floppy disks, mini disks (MD's), optical discs, DVD, CD-ROMs, microdrive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any other type of media or device suitable for storing instructions and/or data.

Stored on any one of the computer readable medium (media), a preferred embodiment includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Such computer readable media may further include software for performing the present invention, as described above.

Included in the programming (software) of the general/specialized computer or microprocessor may be software modules for implementing the teachings of the present invention, including, but not limited to, combining elements needed for optimization, selecting synthesis models, assigning parameter values, selecting and invoking test benches, performing circuit simulations and analysis, and the display, storage, or communication of results according to the processes of the present invention.

The following is a list of preferred MSS design terms and general descriptions which may be applicable to at least one of the embodiments listed above. It should be understood that not every embodiment will use each of the following, or in a similar way, and that variation from these definitions should not be read to limit the invention:

AMS (A/MS)—Analog Mixed Signal: Generally refers to the AMS Simulator. May also refer to AMS language for Verilog (Verilog AMS).

Cell Library: Preferably contains one or more circuits ready for synthesis. May contain circuits without information on how to apply them to particular applications.

Characterizer (Characterization System): Preferably executes information from the Characterization Plan. Typically used before synthesis.

Characteristic Functions: (Part of Synthesis Library) Preferably includes expressions used to build Behavior Optimization Models (tables, curve fitting expressions of circuit characteristics, etc.)

Characterization Plan: A Plan that embodies the information needed to acquire behavior of a given design component within a specified parameter space. Information may include Fabrication Process, Operating Voltage range, Electrical Loading, Temperature, and other user definable parameters.

The characterization plan preferably has the ability to monitor and control the characterization process while simultaneously storing information required for synthesis and simulation (for example, data used to build a table or perform a curve fit).

Circuit Model: A description of an electrical function based on its active and passive components (resistors, transistors, etc.). Preferably describes structure in terms of its components (similar to a spice netlist).

Cost: A metric that gives an indication of the quality of the solution. Each performance value is preferably measured and checked against the corresponding performance specification, and its 'closeness' to the performance specification determines how much it contributes to the cost. If all performance specifications are met, the cost is said to be zero.

Design Flow: Preferably a collection of tools that enable a coherent design process.

Design parameter (Design Variable): Preferably a circuit variable that the optimizer varies, such as transistor length and width. Each design parameter may have a valid range of values within which the optimizer is allowed to use (e.g. dimensions of a transistor, bias current, etc.) (e.g. 2, anything a designer would sit down and adjust in order to make a circuit meet a performance specification).

Look up model: Preferably a collection of one or more points acquired or learned via previous analysis of a circuit. To size an analog cell, the optimizer preferably uses a lookup model containing at least one set of design parameters which produces a working circuit.

Master Plan: Preferably contains instructions readable by two or more tools. The instructions may contain situation specific knowledge on how to apply the tools for at least one part of an overall design.

Model: (Such as a generic circuit model, behavioral model, etc.) Preferably maps the function of design variables to performance parameters.

Mixed Signal Cell Library: Preferred storage for models and associated test benches and scripts.

Optimum solution: A preferred solution whose performance values all meet all user performance specifications and therefore has zero cost.

Optimization: Preferably a process of determining best-sized components, or the best components to configure a circuit that meets performance characteristics/requirements of a circuit being synthesized.

Optimizer: Preferably a device or software program that performs the process of optimization.

Parameterized Netlist (Part of Synthesis Library): Is preferably a part of the circuit model. May involve a circuit model without any specification of component values, or where all component values are set to variables. May include a raw representation of the circuit that a user is attempting to synthesize. The Circuit Model preferably relates to parameterized netlist in a similar manner to behavioral models relating to characteristic functions.

Performance Characteristic: A variable that preferably characterizes a particular performance feature of the circuit, such as power consumption, slew rate, gain.

Performance Specification: Preferably a constraint that the user specifies on a performance characteristic. The optimizer may try to find a point that meets all performance constraints. A performance specification may be a specific value (a target constraint) or a range of values (bound constraint).

Performance Value: Preferably the measured value for a particular performance characteristic given a point.

Point: Preferably a set of design parameters, and corresponding performance characteristics for a given cell characterized in a given process.

Process Models: (Part of Synthesis Library) Preferably a description of the component characteristics in a particular fabrication process.

Silicon Calibrated Behavioral Model: (calibrated Behavioral Model) Preferably includes tables or equations mapping accumulation of circuit information to a behavioral model Simulation Plan: Preferably provides specialized simulator controls for different design components.

Simulator (A/MS Simulator): Preferably makes measurements of a circuit (performance feature measurements, e.g. power, slew rate, gain, etc).

Solution space: The set of all possible points given the set of design parameters and their value ranges.

Solution: A set of design parameter values determined by the optimizer.

Synthesis Plan: Preferably encapsulates knowledge required to synthesize a given design component. May generate a new device-level component from a high-level hardware description (HDL) based on the individual requirements for the given component under design (Thus, specialized computer instructions are stored in the Synthesis Plan, not the synthesizer).

Synthesis Model: Preferably relates design parameters (variables that the optimizer changes) to an observable (by evaluation or by measurement) performance characteristic (such as power, gain, slew rate, etc.). It may be a behavioral optimization model, analytic model, or other type of circuit model.

Synthesis Toolset: Collection of tools, each of which may be provided instructions by a Synthesis Plan being used. Main operational components of the MSS Engine.

Synthesizer: Preferably provides basic tools for pattern matching, optimization, cell selection. May be controlled by the synthesis plan.

Test Benches (V-A/MS Test Benches): (Part of Synthesis Library) Describe one or more configurations for making measurements on a circuit and information for a simulator to be able to run the test bench. The analysis test bench preferably models the circuitry that would be external to the device being optimized, such as stimuli, power supplies, and load devices. The test bench may also control the type of analysis to be performed for optimization of each performance characteristic. Each analysis test bench may be used more than once, in order to analyze circuit performance over multiple operating conditions of temperature, supply voltage, and fabrication process.

Topology Selection: Process of examining different implementations of circuit in order to choose the best one. [choice may be based on a Performance Value, or Performance Characteristic, for example]

Numerous modifications and variations of the present invention are possible in light of the above teachings. It is therefore to be understood that within the scope of the appended claims, the invention may be practiced otherwise than as specifically described herein.

What is claimed is:

1. A method of simultaneously optimizing performance characteristics in circuit synthesis, comprising the steps of:
   (a) receiving an initial set of design parameters for a circuit to be synthesized:
   (b) invoking a simulation script to determine which synthesis models should be used with the circuit and to set ranges for any test benches:
   (c) generating sets of circuit parameters for each performance characteristic of the circuit;
   (d) automatically creating a plurality of test benches, wherein each of the plurality of test benches emulates test circuitry external to the circuit:
   (e) simultaneously passing in parallel each set of circuit parameters through a circuit model as specified by the simulation script;
   (f) simultaneously running in parallel a simulation of each circuit model on the plurality of test benches in order to measure performance of the circuit model using the set of circuit parameters;
   (g) optimizing the circuit synthesis, including receiving the performance measurements for each simulation and determining for which performance characteristics a specifications are met, and, for those analyses where the specifications are not met then generating new circuit parameter values and repeating steps (c) through (g); and
   (h) outputting the final set of circuit parameters for the circuit.

2. A method according to claim 1, further comprising the step of receiving the measurements of performance for each simulation in an optimizer, said optimizer adapted to determine whether specifications were met for said simulation.

3. A method according to claim 2, further comprising the step of generating new set of circuit parameter values in said optimizer.

4. A method according to claim 3, further comprising the step of passing said new set of circuit parameter values through the respective said circuit model.

5. A method according to claim 1, further comprising the step of assigning each analysis to a separate processor for parallel processing.

6. A method according to claim 1, further comprising the step of checking a lookup database for previously optimized performance characteristics.

7. A method according to claim 1, further comprising the step of saving optimized performance characteristics to a lookup database.

8. A method according to claim 1, further comprising the step of setting up ranges for each said analysis test bench and providing circuit parameters using a simulation script.

9. A method according to claim 1, further comprising the step of mapping the function of a circuit parameter to a performance characteristic.

10. A simulation system for simultaneously optimizing performance characteristics in circuit synthesis, comprising:
    (a) an initial set of design parameters for a circuit to be synthesized;
    (b) a simulation script that determines which synthesis models should be used with the circuit, generates sets of circuit parameters for each of a plurality of performance characteristics, and sets ranges for any test benches;
    (c) at least one circuit model for incorporating said set of circuit parameters, each said circuit model adapted to model a portion of said circuit pertaining to a performance characteristic, wherein additional sets of circuit parameters may be passed at the same time in parallel;
    (d) a plurality of test benches that are created automatically in response to invoking the simulation script, wherein each of the plurality of test benches emulates test circuitry external to the circuit; and
    (e) an optimizer that simultaneously passes in parallel each set of circuit parameters through a circuit model as specified by the simulation script, and determines for which performance characteristics the specifications are met, and, for those analyses where the specifications are not met then generates new parameter values and repeats the simulation with the new parameter values.

11. A simulation system according to claim 10 additionally comprising an optimizer adapted to collect the results of said analysis of each said analysis test bench and compare said results to optimal performance specifications for said circuit.

12. A simulation system according to claim 11, wherein said optimizer comprises an optimization algorithm.

13. A simulation system according to claim 12, wherein said optimization algorithm is adapted to generate parameter values to be passed to each said analysis test bench.

14. A simulation system according to claim 10, further comprising a simulator for each said analysis test bench.

15. A simulation system according to claim 10, wherein each said analysis test bench is adapted to run multiple occurrences of said analysis for each said circuit.

16. A simulation system according to claim 10, wherein said analysis may be performed over multiple operating conditions.

17. A simulation system according to claim 16, wherein said multiple operating conditions are selected from the group consisting of temperature, supply voltage, and fabrication process.

18. A simulation system according to claim 10, further comprising a processor for each said circuit model.

19. A simulation system according to claim 10, further comprising at least one simulation script for each said circuit model.

20. A simulation system according to claim 10, further comprising a synthesis plan adapted to set out rules for said analysis.

21. A simulation system according to claim 10, further comprising a lookup database.

22. A simulation system according to claim 21, wherein said lookup database includes a set of performance specifications for each said circuit model.

23. The method of claim 1, wherein the method further includes, during the simulation of each circuit model on the plurality of test benches, checking out a license for each test bench being used from a pool of available simulation licenses.

* * * * *